(12) United States Patent
Chiu

(10) Patent No.: US 7,875,973 B2
(45) Date of Patent: Jan. 25, 2011

(54) PACKAGE SUBSTRATE INCLUDING SURFACE MOUNT COMPONENT MOUNTED ON A PERIPHERAL SURFACE THEREOF AND MICROELECTRONIC PACKAGE INCLUDING SAME

(75) Inventor: Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 451 days.

(21) Appl. No.: 11/851,547

(22) Filed: Sep. 7, 2007

(65) Prior Publication Data

US 2009/0065930 A1 Mar. 12, 2009

(51) Int. Cl.
*H01L 23/48* (2006.01)

(52) U.S. Cl. .................. 257/723; 257/737; 257/E23.01

(58) Field of Classification Search ................. 257/528, 257/678, 737, 774, 723, 734, E23.01
See application file for complete search history.

(56) References Cited

U.S. PATENT DOCUMENTS

| 6,721,187 | B2 * | 4/2004 | Hall et al. ................... 361/760 |
| 6,727,116 | B2 * | 4/2004 | Poo et al. .................... 438/106 |

* cited by examiner

*Primary Examiner*—Roy K Potter
(74) *Attorney, Agent, or Firm*—Blakely, Sokoloff, Taylor & Zafman LLP

(57) ABSTRACT

A microelectronic combination and a method of making the combination. The combination includes a package substrate including a substrate body having a peripheral surface and contacts disposed at the peripheral surface; and a surface mount component electrically and mechanically bonded to the contacts.

10 Claims, 3 Drawing Sheets

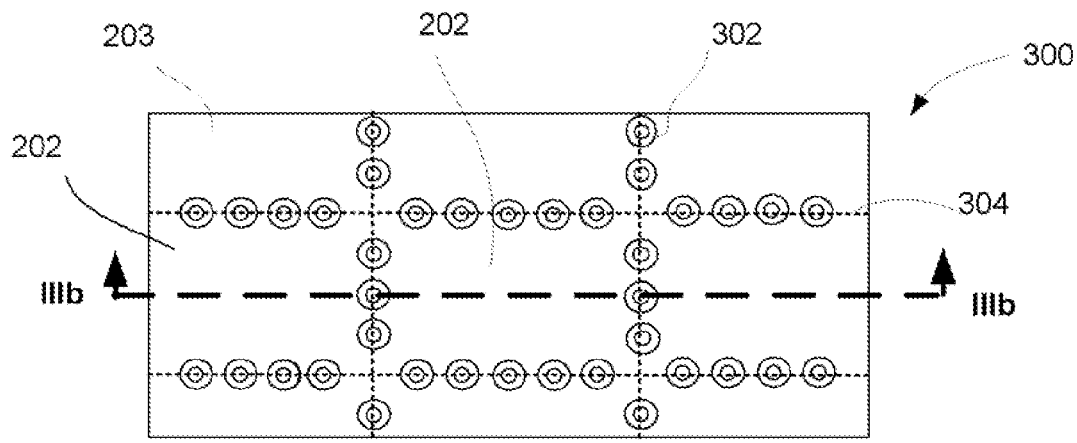
Fig. 3a
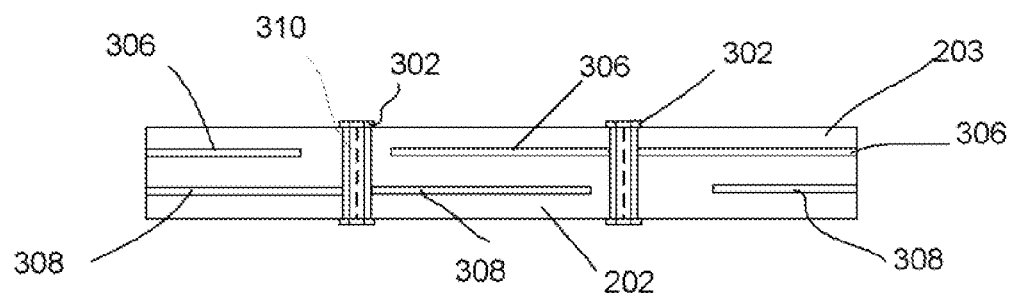
Fig. 3b
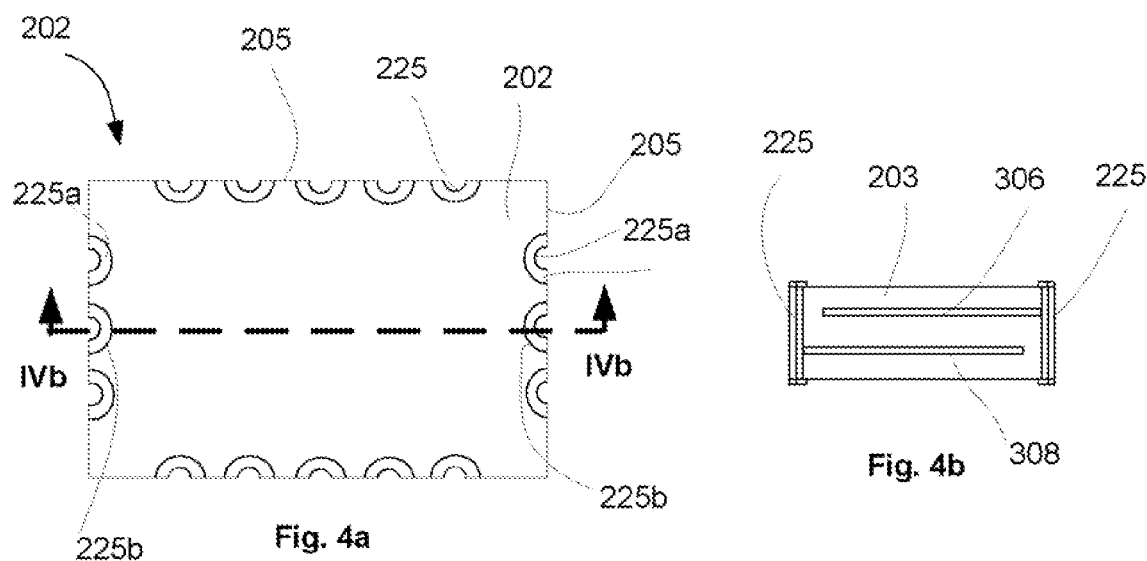
Fig. 4a
Fig. 4b

PACKAGE SUBSTRATE INCLUDING SURFACE MOUNT COMPONENT MOUNTED ON A PERIPHERAL SURFACE THEREOF AND MICROELECTRONIC PACKAGE INCLUDING SAME

FIELD

Embodiments of the present invention relate generally to the field of microelectronic fabrication, and, in particular to a method of attaching surface mount components, such as capacitors, resistors and/or inductors, at a landside or carrier side of a package substrate.

BACKGROUND

In FIG. 1, a conventional microelectronic package 100 is shown including a package 101 comprising a land grid array (LGA) package substrate 102 supporting a die 104 thereon. The die 104 is shown as having been electrically and mechanically joined/bonded to the package substrate 102 by way of an array 106 of solder joints, and further by way of cured underfill material 110 as shown. An integrated heat spreader (IHS) lid 112 is further mounted onto package substrate 102 and thermally coupled to the die 104 by way of a thermal interface material (TIM) 114. Lid 112 is supported on the package substrate 102 by way of sealant 116. The package 101 is in turn supported on and electrically and mechanically bonded to a carrier 118, such as the substrate of a printed circuit board. Carrier 118 includes carrier lands 120 thereon adapted to allow an electrical connection of the carrier 118 to additional circuitry. In turn, package substrate 102 includes substrate lands 122 on a carrier side thereof adapted to allow an electrical connection of the package 101 to external circuitry. The lands 120 and/or 122 may include ENIG pads, for example. Surface mount components (hereinafter SMT) 130, such as capacitors, resistors, inductors, and the like, are shown as having been mounted on the landside of the package using for example solder 105. Such SMT's, when they include capacitors, are sometimes referred to as LSC's or land side capacitors. Additional SMT's may be provided on the package substrate 102, such as SMT 132 mounted on a die side of the package substrate. Such SMT's, when they include capacitors, are sometimes referred to as DSC's or die side capacitors. Even more SMT's may be provided on the carrier 118 itself, such as SMT's 134 as shown. SMT's are typically provided for full performance power delivery. Sockets 152 are placed between the package substrate 102 and carrier 118 in order to provide a standoff between the same to accommodate the SMT's, and in order to house second level interconnects between the substrate and carrier in a well known manner. Sockets 152 include through-contacts 154 extending therethrough, and establishing electrical contact with substrate lands 122 by way of flexible contact portions 156, and establishing electrical contact with carrier lands 120 by way of contact portions 158. Contact portions 158 of through-contacts 154 are bonded to the carrier lands 120 by way of an array of solder joints 160 as shown.

Disadvantageously, SMT's may occupy real estate on the package substrate, and in this way may create their own keep out zones, resulting in larger package substrates than would have been possible if the SMT's were not placed on the package substrate. The prior art attempts to solve the problem above by reducing the size and/or the number of SMT's required on a package substrate. However, the above measure still does not address the fact that, whether small in size or few in number SMT's of the prior art disadvantageously occupy real estate on a substrate.

The prior art fails to provide a microelectronic package where the problems associated with the provision of SMT's on the package substrate are avoided.

BRIEF DESCRIPTION OF THE DRAWINGS

FIG. 3a is a schematic top plan view of a portion of a substrate panel including individual package substrates according to one embodiment;

FIG. 5b is a cross sectional view of the substrate panel of FIG. 3a along lines IIIb-IIIb;

FIG. 4a is schematic top plan view of a package substrate according to an embodiment having been singulated from the panel of FIG. 3a;

FIG. 4b is a cross sectional view of the substrate of FIG. 4a along lines IVb-IVb;

Figure 1:
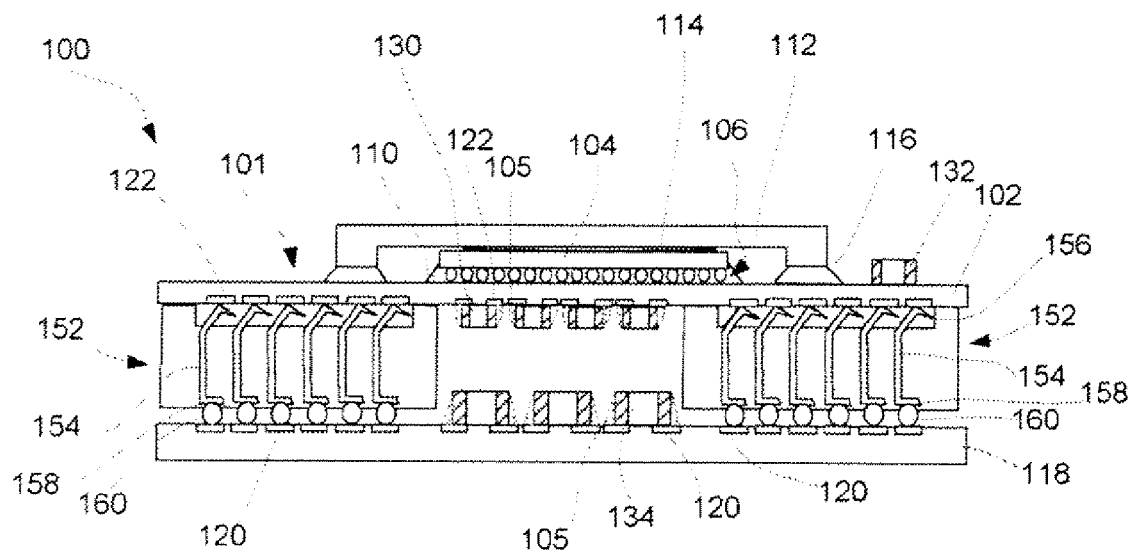
FIG. 1 is a schematic side cross-sectional view of a prior art microelectronic assembly including SMT's disposed on a die side and on a carrier side of a package substrate.

For simplicity and clarity of illustration, elements in the drawings have not necessarily been drawn to scale. For example, the dimensions of some of the elements may be exaggerated relative to other elements for clarity. Where considered appropriate reference numerals have been repeated among the drawings to indicate corresponding or analogous elements.

DETAILED DESCRIPTION

In the following detailed description, a package substrate including a surface mount component mounted to a peripheral surface thereof, a package including the substrate, a method of forming the same and a system including the same are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements. In addition in the instant description, figures and/or elements may be referred to in the alternative. In such a case, for example where the description refers to FIGS., X/Y showing an element A/B what is meant is that FIG. X shows element A and FIG. Y shows element B. Moreover, in the instant description, the expressions "electrically and mechanically bonded to" and "mounted on" are used interchangeably.

Aspects of this and other embodiments will be discussed herein with respect to FIGS. 2-6 below. The figures, however, should not be taken to be limiting, as they are intended for the purpose of explanation and understanding.

Figure 2:
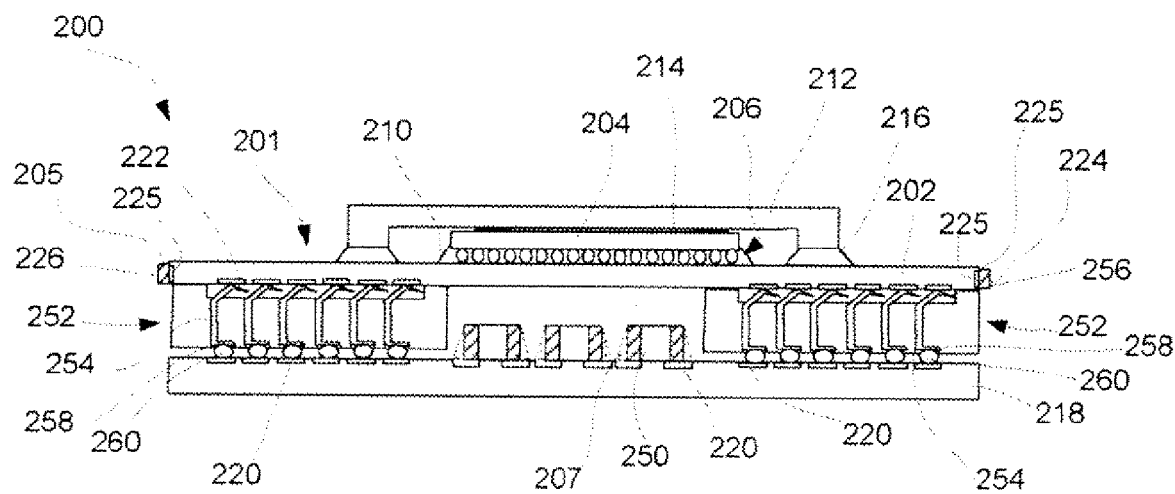
FIG. 2 is a schematic side cross-sectional view of a microelectronic package according to an embodiment.

Referring first to FIG. 2, microelectronic assembly 200 is shown according to an embodiment. Assembly 200 may include a package 201 comprising a package substrate 202 supporting a die 204 thereon and having a die side and a carrier side. The die 204 may be mounted, that is, electrically and mechanically coupled to the package substrate 202 on the die side thereof, by way of an array 206 of first level interconnects including, for example, solder joints, and further by way of cured underfill material 210. Although a C4 solder connection is shown between die 204 and package substrate 202, it is noted that embodiments are not so limited, and include within their ambit any type of first level interconnection between die and package substrate, such as, for example, first level interconnects including wirebonds, conductive adhesives, or any other ones of well known die to substrate interconnects as would be within the knowledge of a skilled person. An integrated heat spreader (IHS) lid 212 may further be mounted onto package substrate 202 and thermally coupled to the die 204 by way of a thermal interface material (TIM) 214. Lid 212 is supported on the package substrate 202 by way of sealant 216. Additionally, although a lid IHS is shown in the embodiments of FIG. 2, it is noted that embodiments are not so limited, and include within their scope a package that does not include an IHS, and/or one that includes an IHS not necessary limited to a lid. The package 201 may in turn be mounted on, that is, electrically and mechanically coupled to, a carrier 218, such as the substrate of a circuit board. Carrier 218 may have a substrate side, and may include carrier lands 220 on the substrate side thereof adapted to allow an electrical connection of the carrier 218 to additional circuitry. In turn, package substrate 202 may include substrate lands 222 on the carrier side thereof adapted to allow an electrical connection of the package 201 to external circuitry. The lands 220 and/or 222 may include ENIG pads, for example, or any other type of land as would be within the knowledge of a skilled person. As further seen in FIG. 2, SMT's 250 may be mounted onto the carrier 218, that is, electrically and mechanically bonded to carrier 218, by way of corresponding carrier lands 220 by way of solder 207 as shown. According to an embodiment, one or more sockets 252 may be placed between the package substrate 202 and carrier 218 in order to provide a standoff between the same to accommodate the SMT's 250, and in order to house second level interconnects between the substrate and carrier in a well known manner. Thus, sockets 252 may include through-contacts 254 extending therethrough, and establishing electrical contact with substrate lands 222 by way of flexible contact portions 256, and establishing electrical contact with carrier lands 220 by way of contact portions 258. By way of example, the contact portions 258 of through-contacts 254 may be bonded to the carrier lands 220 by way of an array of solder joints 260 as shown.

Figure 5:
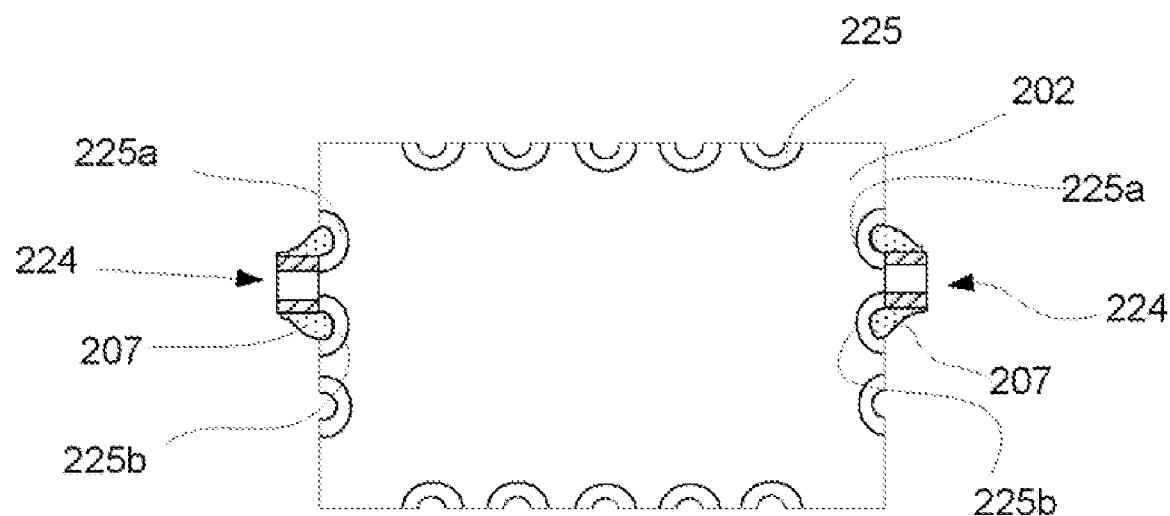
FIG. 5 is a schematic top plan view of a combination including the substrate of FIG. 3b and a capacitor mounted to an edge surface thereof according to an embodiment.

Reference with now be made to both FIG. 2 described in part above, and also to FIG. 5, which shows a top plan view of a microelectronic combination including the package substrate of FIG. 2 and SMT's mounted thereon as wilt be explained in further detail below. As seen in FIGS. 2 and 5, the package substrate 202 according to the shown embodiment may include a substrate body 203 having a peripheral surface 205. By "peripheral surface," what is meant in the context of the instant description is a surface spanning a periphery of the substrate body and extending around the substrate body between the die side surface of the package substrate 202 and the carrier side surface of the package substrate 202 in a direction of the thickness of the substrate body 203 (the thickness direction being shown in particular in FIG. 2). According to embodiments, the package substrate 202 includes contacts 225 disposed at the peripheral surface 205 thereof, as best seen in FIG. 5. According to the instant description, a "contact" of a component A refers to a conductive element on a surface of component A that is connected to electrical pathways extending within component A. The conductive element may allow a connection of such electrical pathways to circuitry external to component A. According to embodiments, a SMT may be electrically and mechanically bonded to the contacts. For example, where the contacts 225 include at least one pair of contacts including a power contact and a ground contact, an SMT may be electrically and mechanically bonded to both the power contact and the ground contact at the peripheral surface of the package substrate. By way of example, an SMT may include, as shown in the embodiment of FIGS. 2 and 5, a plurality of SMT's, such as SMT's 224 and 226, which may be electrically and mechanically bonded to corresponding ones of the contacts including power contacts 225a and ground contacts 225b. According to an embodiment, the contacts include metal plating on the peripheral surface, such as, in the shown embodiment of FIGS. 2 and 5, respective halves of plated through-holes extending through a thickness of the package substrate, as best seen in FIG. 5. According to an embodiment, the contacts 225 may be substantially evenly dispersed about the peripheral surface 205, such that a plurality of SMT's may be mounted on corresponding ones of such contacts.

Although not shown, it is understood that a variety of components other than the die 204 and SMT's may be placed on the package substrate or on the carrier as appropriate, including an On-Package-Voltage-Regulation device, or OPVR, an Integrated Semiconductor Voltage Regulator or ISVR, a Dynamic Random Access Memory or DRAM, or various other devices as would be within the knowledge of a skilled person. In addition, embodiments are not limited to a LGA package substrate as shown in the current figures, but include within their scope other types of package substrates as would be within the knowledge of the skilled person, such as, for example, a PSA package substrate or a BGA package substrate according to application needs. Additionally, embodiments are not limited to the provision of SMT's only on the peripheral surface of a package substrate, but include within their scope the provision of SMT's as shown for example in FIG. 1, such as, for example, on at least one of the die side of the package substrate, the carrier side of the package substrate and the substrate side of the carrier. Moreover, embodiments are not limited to a microelectronic assembly that includes one or more sockets disposed between the package substrate and carrier, but comprise within their scope any microelectronic assembly including the microelectronic combination of a package substrate having SMT's mounted on its peripheral surface, such as a microelectronic assembly where there is not socket between the package substrate and the associated carrier. In addition, embodiments are not limited to a package substrate where the contacts on the peripheral surface are substantially evenly distributed on such surface, but include within their scope one or more such contacts disposed at the peripheral surface in any suitable manner according to application needs, such as at any suitable location on which a SMT may be mounted.

Reference will now be made to FIGS. 3a-3b, 4a-4b and 5, where a method embodiment to form a microelectronic combination as described above in relation to FIG. 5 with be described.

Referring first to FIGS. 3a and 3b, a method embodiment may include providing plated through holes (PTH's) 302 on a substrate panel 300 between individual package substrates 202. According to the shown embodiment, the PTH's 302 may be provided along streets 304 on the substrate panel 300 along which the panel may be later singulated to yield individual substrates 202. It is noted that, in the shown embodiment of FIGS. 3a-3b and 4a-4b, the individual package substrates 202 correspond to the package substrate 202 of FIG. 2 and of FIG. 5 as described above, although method embodiments are not so limited. Each PTH 302 corresponds to an eventual location of a contact 225 on the substrate 202, as will be explained in further detail below. Provision of PTH's may be performed according to any one of well known methods for providing PTH's, as would be within the knowledge of a skilled person. According to an embodiment, and as best seen in FIG. 3b, each PTH 302 may be provided at a location between the package substrates 202 such that each PTH is connected to either a power layer 306 or a ground layer 308 of the adjoining substrates 202.

Referring next to FIGS. 4a and 4b, the panel 300 of FIGS. 5a and 3b may be singulated according to a method embodiment along streets 304 using any one of well known singulation techniques to form individual package substrates such as package substrate 202 of FIG. 4b. Singulation according to an embodiment may expose the metal plating 310 of each PTH 302 (FIGS. 3a and 3b) on the package edges, that is, on a peripheral surface 205 of each package substrate 202. After singulation, each partial PTH corresponds to a contact 225 according to an embodiment, such as, for example, any one of the contacts 225 of FIGS. 2 and 5. As shown specifically in FIG. 4b each of the contacts 225 is one of a power contact 225a or a ground contact 225b by virtue of being connected to either a power layer 306 or a ground layer 308, as explained above with respect to FIG. 3b.

Referring next to FIG. 5, a method embodiment may further include electrically and mechanically bonding a SMT to the contacts, such as, for example, soldering SMT's 224 and 226 to corresponding contacts 225 on the peripheral surface 205 of the package substrate 202. Bonding one or more SMT's to contacts on the peripheral surface of the package substrate as shown in FIG. 5 would result in a package substrate 202 such as one shown in the microelectronic assembly of FIG. 2.

It is noted that, although the above description pertains to a method of providing PTH's in a substrate panel to eventually result in individual contacts on peripheral surfaces of individual substrates, embodiments are not so limited, and include within their scope the provision of contacts on a peripheral surface of a packages substrate in any manner as would be within the knowledge of a skilled person, such contacts not necessarily being limited to partial PTH's.

Advantageously, embodiments provide a reliable, cost-effective package substrate structure and method that address the disadvantages of the prior art with respect to SMT's taking up real estate on the die side or on the carrier side of package substrates. In particular, embodiments provide a structure and method involving the provision of contacts on a peripheral surface of a package substrate, allowing the mounting of SMT's onto those contacts, in this way advantageously eliminating SMT keep out zones on the die side or carrier side of the package substrate, and making possible the provision of package substrates that are smaller than prior art package substrates. In addition, embodiments advantageously allow the use of smaller sockets in microelectronic assemblies between package and carrier, and may even allow the elimination of such sockets by reducing the standoff requirement between package and carrier. Moreover, a method embodiment makes possible the use of PTH's on a substrate panel as precursors to contacts on peripheral surfaces of substrates to be singulated from the panel, in this way allowing the manufacturing of package substrates according to embodiments in a simple and cost-effective manner.

Figure 6:
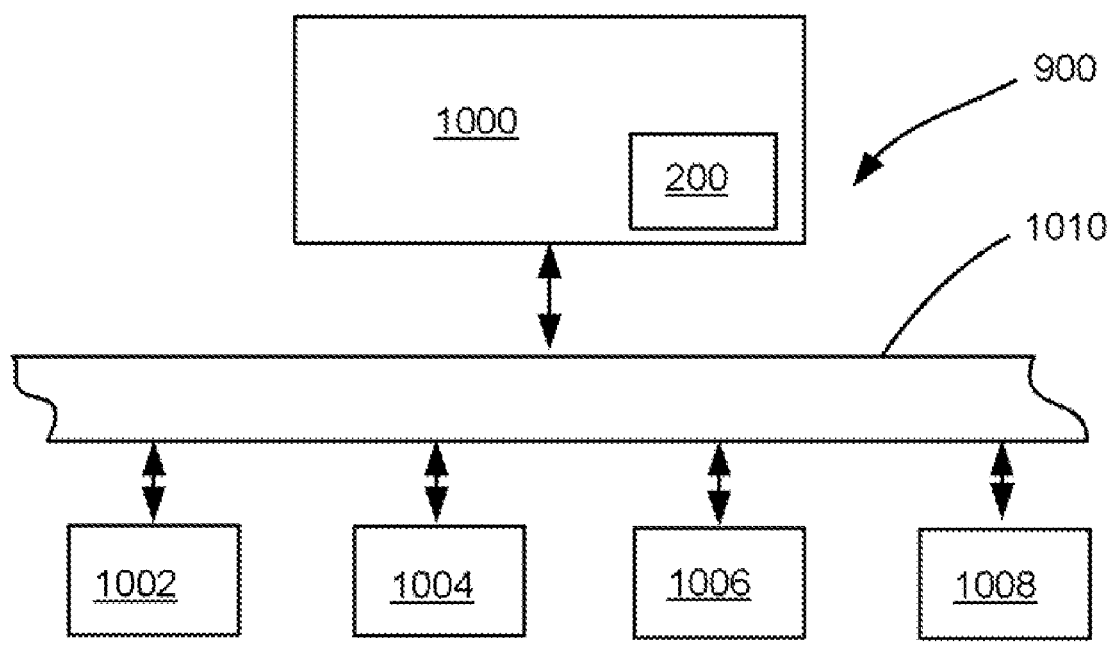
FIG. 6 is a schematic view of an embodiment of a system incorporating a microelectronic package as shown in FIG. 2.

Referring to FIG. 6, there is illustrated one of many possible systems 900 in which embodiments of the present invention may be used. In one embodiment, the electronic arrangement 1000 may include a microelectronic assembly, such as assembly 200 of FIG. 2. Arrangement 1000 may further include a microprocessor. In an alternate embodiment, the electronic arrangement 1000 may include an application specific IC (ASIC). Integrated circuits found in chipsets (e.g., graphics, sound, and control chipsets) may also be packaged in accordance with embodiments of this invention.

For the embodiment depicted by FIG. 6: the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (OVO), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer: a set-top box, a media-center PC, a DVD player, and a server.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof.

What is claimed is:

1. A microelectronic combination including;
   a package substrate including a substrate body having a peripheral surface and contacts disposed at the peripheral surface; and
   a surface mount component electrically and mechanically bonded to the contacts, wherein the contacts include a pair of contacts comprising a power contact and a ground contact.

2. A microelectronic combination including;
   a package substrate including a substrate body having a peripheral surface and contacts disposed at the peripheral surface; and
   a surface mount component electrically and mechanically bonded to the contacts, wherein the contacts include metal platings on the peripheral surface.

3. The combination of claim 2, wherein the contacts include respective halves of plated through holes extending through a thickness of the package substrate.

4. A microelectronic combination including;
   a package substrate including a substrate body having a peripheral surface and contacts disposed at the peripheral surface; and
   a surface mount component electrically and mechanically bonded to the contacts, wherein the contacts are substantially evenly dispersed about the peripheral surface, and wherein the surface mount component comprises a plurality of surface mount components each of which is electrically and mechanically bonded to corresponding ones of the contacts.

5. A microelectronic combination including;
a package substrate including a substrate body having a peripheral surface and contacts disposed at the peripheral surface; and
a surface mount component electrically and mechanically bonded to the contacts, wherein the package substrate is one of a LGA package substrate, a BOA package substrate and a PGA package substrate.

6. A microelectronic combination including;
a package substrate including a substrate body having a peripheral surface and contacts disposed at the peripheral surface; and
a surface mount component electrically and mechanically bonded to the contacts, further including a microelectronic package comprising the package substrate, and a die mounted on a die side of the package substrate.

7. The combination of claim 6, further including a microelectronic assembly comprising the microelectronic package and a carrier, the package being mounted on the carrier.

8. The combination of claim 7, wherein the surface mount component is a first surface mount component, the combination further including a second surface mount component electrically and mechanically bonded to one of a die side of the package substrate a carrier side of the package substrate, and a substrate side of the carrier.

9. A package substrate including:
a substrate body having a peripheral surface; and
contacts disposed at the peripheral surface of the substrate body, wherein the contacts are substantially evenly dispersed about the peripheral surface and wherein a plurality of surface mount components are each electrically and mechanically bonded to respective ones of the contacts.

10. A package substrate including:
a substrate body having a peripheral surface; and
contacts disposed at the peripheral surface of the substrate body, wherein the package substrate is one of a LGA package substrate, a BOA package substrate and a PGA package substrate.

* * * * *